United States Patent [19]

Nozokido et al.

[11] Patent Number: 5,065,097
[45] Date of Patent: Nov. 12, 1991

[54] TESTING METHOD AND APPARATUS BY USE OF NMR

[75] Inventors: Tatsuo Nozokido, Kokubunji; Etsuji Yamamoto, Akishima; Hideki Kohno, Tama, all of Japan

[73] Assignee: Hitachi, Ltd., Tokyo, Japan

[21] Appl. No.: 500,901

[22] Filed: Mar. 29, 1990

[30] Foreign Application Priority Data

Mar. 31, 1989 [JP] Japan .................. 01-078229

[51] Int. Cl.$^5$ .......................................... G01R 33/20
[52] U.S. Cl. .................................................. 324/309
[58] Field of Search ............... 324/300, 307, 309, 318, 324/322

[56] References Cited

U.S. PATENT DOCUMENTS

| | | | |
|---|---|---|---|
| 4,719,423 | 1/1988 | Vinegar et al. | 324/307 |
| 4,769,602 | 9/1988 | Vinegar et al. | 324/307 |
| 4,885,539 | 12/1989 | Roemer et al. | 324/318 |

OTHER PUBLICATIONS

Journal of Magnetic Resonance 70, 163-168 (1986).

*Primary Examiner*—Michael J. Tokar
*Attorney, Agent, or Firm*—Antonelli, Terry, Stout & Kraus

[57] ABSTRACT

A testing method and apparatus by use of nuclear magnetic resonance measure, at timings influenced and not influenced from chemical shift, nuclear magnetic resonance signals taken from a sample to be tested at least one of whose values of permeability and chemical shift is known and a reference sample both of whose values of permeability and chemical shift and their spatial distribution are uniform thereby to acquire four items of image vector information. Further, the testing method and apparatus take phase differences between the items of image vector information to separately extract the phase component influenced by the permeability distribution and the phase component influenced from the chemical shift.

14 Claims, 3 Drawing Sheets

F I G. 1A
F I G. 1B
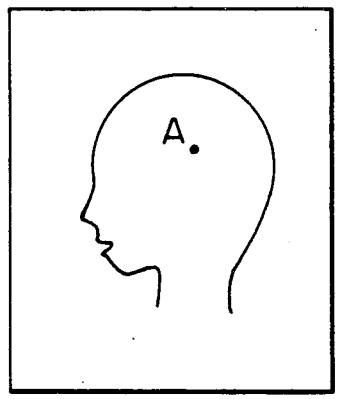
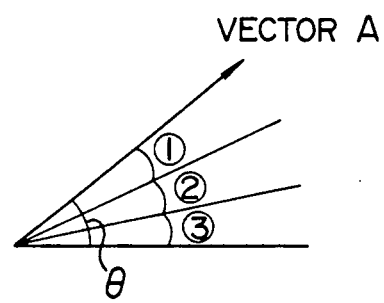
F I G. 2A
F I G. 2B
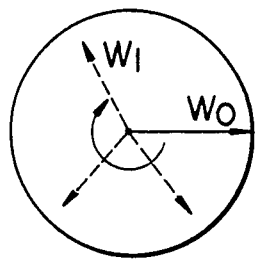
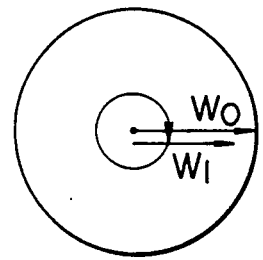

TESTING METHOD AND APPARATUS BY USE OF NMR

BACKGROUND OF THE INVENTION

The present invention relates to a method and apparatus for imaging or visualising the distribution relative to the component e.g. hydrogen and phosphorus contained in an object to be tested, i.e. sample by use of nuclear magnetic resonance (NMR), and more particularly to a testing method and apparatus by use of NMR which is suitable to decide the values of permeability and chemical shift in the sample and to image their distribution.

A technique of imaging or image-displaying the permeability distribution of a living body as a sample has been disclosed in JOURNAL OF MAGNETIC RESONANCE Vol. 70, pp. 163–168 (1986). This technique image-displays the phase information of the reconstructed image of a sample acquired by the testing apparatus using NMR and tests the distribution of the relative permeability by the image density.

This related art has the following disadvantage. Although it apparently displays the permeability distribution, actually it only displays simultaneously the phase distributions due to the permeability distribution and to the chemical shift; the former and the latter are discriminated so that the values of the permeability and the chemical shift can not be determined.

SUMMARY OF THE INVENTION

The present invention intends to extract only the phase information due to permeability distribution, display an image containing the phase information due to only chemical shift using the extracted information, and provide a method and apparatus for acquiring the values of the permeability and the chemical shift and their distribution.

Generally, the image (tomogram) constructed using an NMR signal is based on the absolute value expressed in vector form. This vector information includes the phase components due to the following three influences depending upon the detecting timings of the NMR signal.

① nonuniformity in a static magnetic field which indicates the change from the mean value of the generated static magnetic field, ② permeability distribution which is defined by the magnetic field intensity varying depending upon the structure of a sample to be tested, i.e., permeability distribution and ③ chemical shift which is defined as the deviation ratio of the magnetic flux density in which a nuclear spin of interest is excited in a molecule. The magnetic flux density deviates in dependence of a molecular structure.

On an actual image as shown in FIG. 1A, the phase of point A is determined by the components ①, ②, and ③ as shown in FIG. 1B. In actual diagnosis and analysis, the NMR signal in the site abundant in blood is greatly influenced from the component ②; in order to determine the molecular structure of a sample to be tested, the phase information influenced from the above item ③ is required. For example, in diagnosing of cerebral hemorrhage, it is desirable to extract only the phase information due to the item ② from the NMR signal so that a large amount of the information required for the diagnosis can be surely obtained.

The present invention intends to provide a method and apparatus for separating items of phase information due to the influence from the above items and ② and ③ to individually extract the items of phase information.

In order to attain the object of the present invention, an arithmetic operation must be carried out using the measurement results for the following two samples.

1. A reference sample whose values of permeability and chemical shift, which are spacially uniformly distributed, are known.
2. A sample to be tested either one of whose values of permeability and chemical shift is known.

These two samples are photographed in the same sequence, and subtraction between items of the phase information of the images thus obtained provides the phase $\Theta$ expressed by $$\Theta = \alpha T \Delta B_0 \qquad (1)$$

where $\Delta B_0$ is a difference between the magnetic flux densities within the above samples 1 and 2, $\alpha$ is a proportional constant, and T is a time interval depending upon the timing of detecting an NMR signal and so the time passed from the detecting timing a in FIG. 4.

Thus, the phase of the image information and the magnetic flux density are in a proportional relationship so that the phase computed can be easily transformed into the magnetic flux density, and vice versa.

It should be understood that taking a difference between items of the phase information of two images enables the either one of the items ① ② and ③.

Now it is assumed that the sample to be tested contains two kinds of chemical shift. In this case, the rotating speed of the nuclear spin after excited depends on the value of the chemical shift. With one nuclear spin fixed as shown in FIG. 2A, the other nuclear spin rotates at the speed relative to that of the one nuclear spin. However, both nuclear spins overlap at the position of the phase zero, as shown in FIG. 2B, when a certain time $(T_2)$ is passed after the time when TE/2 has passed after the application of a 180° pulse so that the NMR signal reaches the maximum level. Then, if the NMR signal is measured, the phase information free from the influence from the chemical shift. It is known that use of the reference sample which is sufficiently larger than the sample to be tested or has a spherical shape provides the NMR signal free from the influence from the item ②. Thus, if such a reference sample and the sample to be tested are measured in the same pulse sequence at a prescribed time free from the influence from the chemical shift and the other time, the following items of phase information can be obtained.

Reference sample:
  when measured at a prescribed time, the information thus obtained includes the influence from ① ... (2)
  when measured at the other time, the information includes the influence from ①' ... (3)
(①' is due to the difference in the measuring timing)
Sample to be tested:
  when measured at a prescribed time, the information thus obtained includes the influence from and ① and ② ... (4)
  when measured at the other time, the information thus obtained includes the influence from ①', ②' and ③ ... (5)

(①)' and (②)' are due to the difference in the measuring timing)

Thus, Equation (4)-Equation (2) provides the phase information including the influence from (②), and Equation (5)-Equation (3) provides the phase information including the influence from (②)' and (③). Further, the relationship between and (②) and (②)' can be computed, and consequently the phase information including the influence from (③).

BRIEF DESCRIPTION OF THE DRAWINGS

FIGS. 1A and 1B are views showing an image constructed using an NMR signal, and a vector constituting the image;

FIGS. 2A and 2B are views showing the movement of nuclear spins based on two kinds of chemical shift;

DESCRIPTION OF THE PREFERRED EMBODIMENTS

Figure 3:
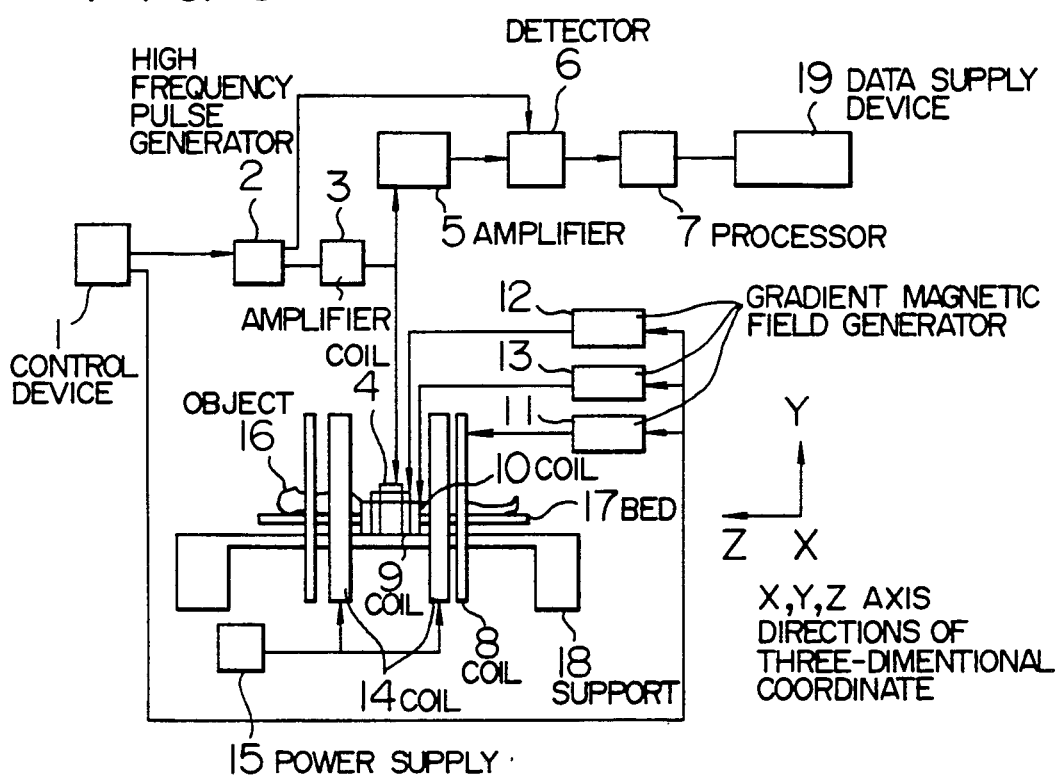
FIG. 3 is a block diagram of the system according to the present invention.

FIG. 3 shows the arrangement of the testing system using NMR according to one embodiment of the present invention. A control device 1 provides several kinds of instructions to the devices described below at a prescribed timing. The output from a high frequency pulse generator 2, which is amplified by an amplifier 3, excites a coil 4. The signal component received by the coil 4 is amplified by an amplifier 5. The signal component amplified is detected by a detector 6. The detected signal is converted into an image by a signal processor 7. Gradient magnetic fields in a Z-axis direction of three-dimension coordinate and the directions perpendicular thereto are generated by coils 8, 9 and 10 which are driven by gradient magnetic field generators 11, 12 and 13, respectively. A static magnetic field is generated by a coil 14 which is driven by a power supply 15. The coil 9 has the same shape as the coil 10 and is 90° rotated around the Z-axis for the coil 9; the coils 9 and 10 generate the gradient magnetic fields perpendicular to each other. An object 16 to be tested (e.g. living body) is placed on a bed 17 which moves on a support 18. 19 is a device for supplying the data on the structure of the object to be tested.

Figure 4:
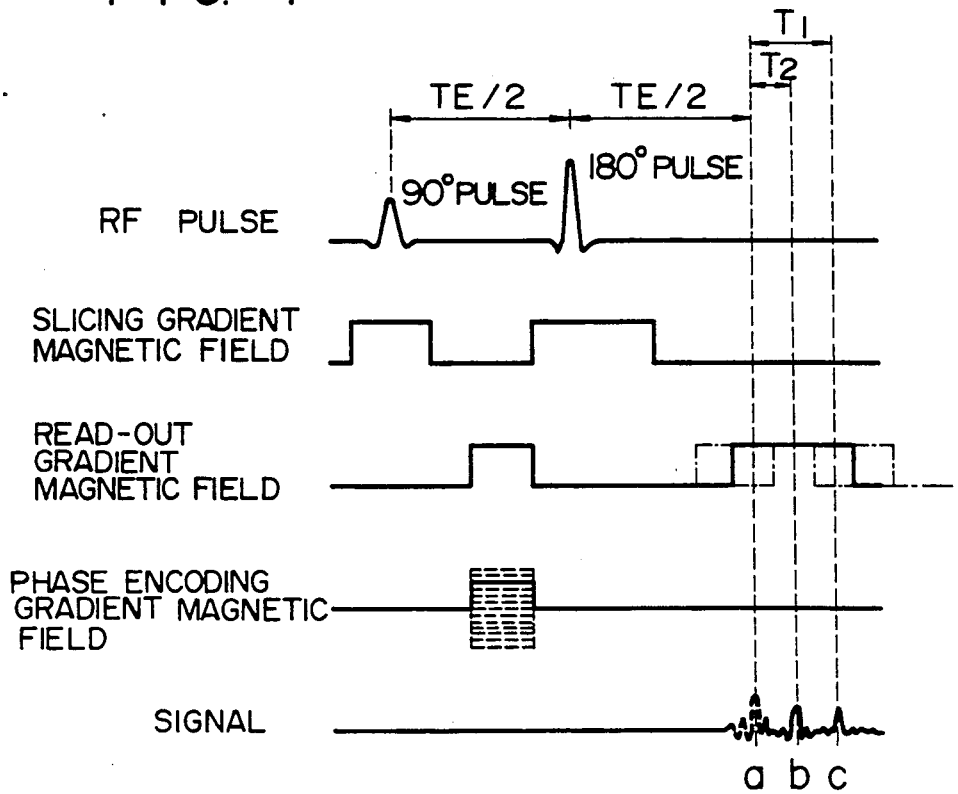
FIG. 4 is a pulse sequence chart adopted in the present invention.

FIG. 4 is a timing chart showing the pulse sequence used in the testing method according to the present invention.

Although the NMR signal at the maximum level can be measured at timing a, it does not include any of the components (①), (②) and (③). For this reason, in accordance with the present invention, the NMR signal is measured at the timing other than the timing a. At timing b, the NMR signal free from the influence from the component (③), i.e. chemical shift can be measured. Thus, the phase information expressed by Equations (2) and (4). At timing c, the phase information expressed by Equations (3) and (5) can be acquired. This timing c may be any other timing than the timings a and b.

Generally, nonuniformity E (x, y) in the distribution (taken in a two-dimensional coordinate) of magnetic flux densities within a sample to be tested can be expressed by $$E(x, y) = E_{st}(x, y) + E_{per}(x, y) \tag{6}$$

where $E_{st}$ (x, y) represents the nonuniformity of the static magnetic field applied from outside of the sample to be tested, and $E_{per}$ (x, y) represents change in the magnetic flux density due to the distribution of the permeability of the sample to be tested.

Now, a sample containing two kinds of materials having chemical shifts $\sigma_1$ and $\sigma_2$ (PPm) is taken as a sample to be tested. The vector information S (x, y) of the image reconstructed when the NMR signal from the sample is measured at the timing c in the pulse sequence shown in FIG. 4 can be expressed by $$S_1(x, y) = \{\rho_1(x, y) + \rho_2(x, y)\exp(j\theta_c)\} \times \tag{7}$$
$$\exp\{-j\gamma[E_{st}(x, y) + E_{per}(x, y) + \sigma_1] \cdot T_1 + j\theta_a\}$$

(which corresponds to Equation (5)) where $T_1$ is any time other than the timings a and b, $\rho_1$ is the density of the material having the chemical shift $\sigma_1$, $\rho_2$ is the density of the material having the chemical shift $\sigma_2$, $\gamma$ is a gyromagnetic ratio, $\Theta_a$ is the phase independent of coordinates, and $\Theta_c$ can be expressed by $$\Theta_c = \gamma(\sigma_1 - \sigma_2)B_0 T_1 \tag{8}$$

where $B_0$ represents the spatial average value of the static magnetic field applied.

For the purpose of setting the measurement timing not influenced from the chemical shift, if $T_2$ in Equation (8) is set so that $\theta_c = 2\pi$ (rad), i.e. as expressed by $$T_2 = \frac{2\pi}{\gamma(\sigma_1 - \sigma_2)B_0} \tag{9}$$

Equation (7) can be expressed by $$S_2(x, y) = \{\rho_1(x, y) + \rho_2(x, y)\} \times \exp\{-j\gamma[E_{st}(x, y) + \tag{10}$$
$$E_{per}(x, y) + \sigma_1] \cdot T_2 + j\theta_a'\}$$

(which corresponds to Equation (4)).

Next, the NMR signal of a reference sample which is filled with the chemical shift $\sigma_1$, sufficiently larger and more uniform than the sample to be tested is measured at the same timing $T_1$ as that when Equation (7) is acquired. The vector information $S_{1r}$ (x, y) of the image thus reconstructed can be expressed by $$S_{1r}(x, y) = \rho_1(x, y) \cdot \exp\{-j\gamma[E_{st}(x, y) + \sigma_1] \cdot T_1 + j\theta_r\} \tag{11}$$

(which corresponds to Equation (3)) where $\theta_r$ represent a constant phase independent of coordinates.

Next, in order to acquire the phase information not influenced from the chemical shift, the NMR signal from the reference sample is measured at the timing $T_2$ expressed by Equation (9). The vector information $S_{2r}$ (x, y) of the image thus reconstructed can be expressed by $$S_{2r}(x, y) = \rho_1(x, y) \cdot \exp\{-j\gamma[E_{st}(x, y) + \sigma_1] \cdot T_2 + j\theta_r'\} \tag{12}$$

(which corresponds to Equation (2)) where $\theta_r'$ is a fixed phase independent of coordinates.

In order to extract the phase information influenced by only the permeability distribution using the phase information relative to two images of the reference sample and the sample to be tested from which have been measured without being influenced from the chemical shift, a difference between the items of phase information relative to the two images is taken. Thus, the phase component due to the influence from nonuniformity of the static magnetic field can be eliminated. This can be performed, using Equations (10) and (12), by calculating $$R(x, y) = \{S_2(x, y)/|S_2(x, y)|\} \times \{S_{2r}^*(x, y)/S_{2r}(x, y)|\} \quad (13)$$

where * indicates a conjugate complex number.

Thus, $$R(x, y) = \exp\{-j\gamma E_{per}(x, y) \cdot T_2 + j(\Theta_a' - \Theta_r')\} \quad (14)$$

In order to extract the value of $E_{per}$, it is necessary to cancel the fixed value $(\Theta_a' - \Theta_r')$.

In Equation (14), R (x, y) at the coordinate $E_{per}$ (x, y)=0 provides the value of $(\Theta_a' - \Theta_r')$. Calculation of $R(x, y) \cdot \exp\{-j(\Theta_a' - \Theta_r')\}$ provides $$R'(x, y) = \exp\{-j\gamma E_{per}(x, y) \cdot T_2\} \quad (15)$$

which does not include $(\theta_a' - \theta_r')$.

The phase angle $\theta_R(x, y)$ at each of coordinates of R' (x, y) which is equal to $-\gamma E_{per}(x, Y) T_2$ provides the change $E_{per}$ in the magnetic flux density due to the permeability distribution expressed by $$E_{per}(x, y) = -\theta_R(x, y)/\gamma T_2 \quad (16)$$

In order to acquire the phase information due to the influence of the chemical shift, a difference between Equation (7) and Equation (11) is taken thereby deleting the phase component due to the influence from nonuniformity of the static magnetic field. This can be performed by calculating $$T(x, y) = \{S_1(x, y) \times S_{1r}^*(x, y)/S_{1r}(x, y)\} \quad (17)$$

Equation (17) includes the phase components ②' and ③ in Equation (5).

In order to eliminate the influence from ②', the component $-$②' is added. This is performed using the value of $E_{per}(x, y)$ in Equation (16) by calculating $$\begin{aligned} T'(x, y) &= T(x, y) \cdot \exp\{j\gamma E_{per}(x, y) \cdot T_1\} \\ &= \{\rho_1(x, y) + \rho_2(x, y) \cdot \exp(j\theta_c)\} \cdot \\ &\quad \exp\{j(\theta_a - \theta_r)\} \end{aligned} \quad (18)$$

The influence from the chemical shift is included in the phase $j\theta_c$. The fixed value $(\theta_a - \theta_r)$ can be deleted by calculating.

$$\begin{aligned} C(x, y) &= T'(x, y) \cdot \exp\{-j(\theta_a - \theta_r)\} \\ &= \rho_1(x, y) + \rho_2(x, y)\exp(j\theta_c) \end{aligned} \quad (19)$$

Thus, the phase information including only the influence from the chemical shifts can be acquired.

In the case where the chemical shift $\sigma_1$ is known and $\sigma_2$ is unknown, if $\theta_c$ is obtained from Equation (19), $\sigma_2$ can be determined using Equation (8) as $$\sigma_2 = \sigma_1 - \theta_c/(\gamma B_0 T_1) \quad (20)$$

The permeability distribution and its value can be determined using $E_{per}(x, y)$ acquired from Equation (16) in the following process.

(a) The structure of a sample to be tested (location of the material(s) contained therein) is detected and it is supplied to an image processing device.

(b) Roughly assumed permeability distribution is predicted on the basis of the structure, and the predicted distribution is simulated by a computer so that it coincides with the measured $E_{per}(x, y)$, thereby determining the details of the permeability distribution and its value to be displayed.

Figure 5:
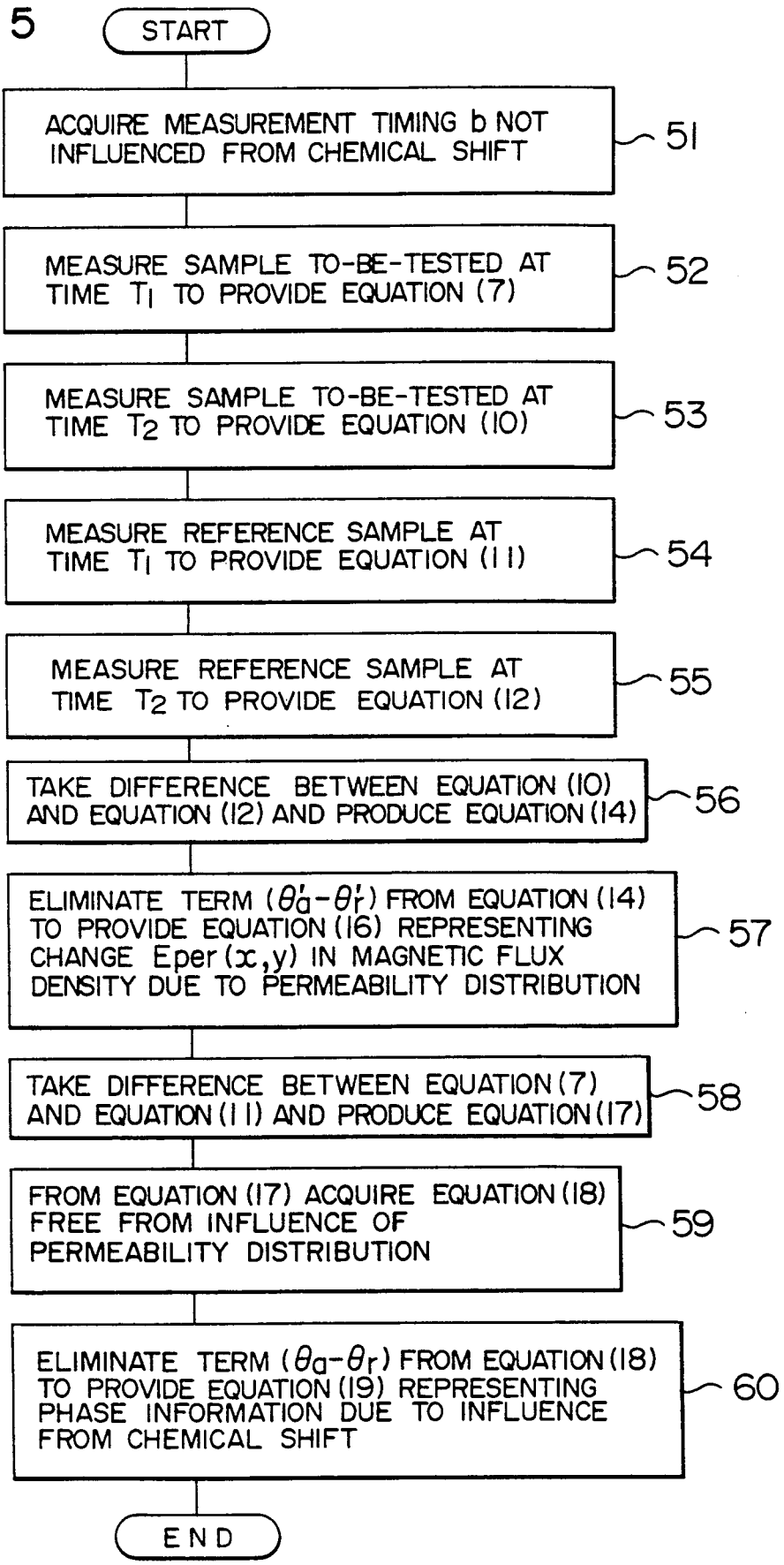
FIG. 5 is a flow chart of the testing method according to the present invention.

The flowchart of the testing method according to the present invention is shown in FIG. 5. The following operations are performed in respective steps.

Step 51: after a 180° high frequency pulse is applied, timing a when an interval between timings of applying a 90° pulse and the 180° high frequency pulse has passed and timing b when an NMR signal from the sample to be tested can be measured without being influenced by the chemical shift thereof are determined.

Step 52: the NMR signal from the sample to be tested is measured at the time $T_1$ in the pulse sequence in FIG. 4 to provide of Equation (7) of the vector information of the reconstructed image.

Step 53: the NMR signal from the sample to be tested is measured at the time $T_2$ in FIG. 4 without being influenced by the chemical shift to provide Equation (10) of the vector information of the reconstructed image.

Step 54: the NMR signal from a reference sample is measured at the time $T_1$ to provide Equation (11) of the vector information of the reconstructed image.

Step 55: the NMR signal from the reference sample is measured at the time $T_2$ to provide Equation (12) of the vector information of the reconstructed image.

Step 56: a phase difference between Equations (10) and (12) is taken to provide Equation (14) free from the influence of nonuniformity of the static magnetic field.

Step 57: the term $(\theta_a' - \theta_r')$ is removed from Equation (14) to provide Equation (16) representing the change $E_{per}(x, y)$ in the magnetic flux density due to the permeability distribution using the phase angle at each of coordinates.

Step 58: in order to eliminate the influence from nonuniformity of the static magnetic field, a phase difference between Equations (7) and (11) is taken to provide Equation (17) representing the phase information due to only the influence from the chemical shift.

Step 59: Equation (17) is subjected to an arithmetic operation for eliminating the influence from the permeability distribution to acquire Equation (18).

Step 60: the term $(\theta_a - \theta_r)$ is eliminated from Equation (18) to provide Equation (19) representing the phase information due to only the chemical shift.

We claim:

1. A testing method by use of nuclear magnetic resonance comprising the steps of:
   (a) determining, after a 180° high frequency pulse is applied, timing a when an interval between timings of applying a 90° pulse and the 180° high frequency pulse has passed and timing b when an NMR signal from the sample to be tested can be measured without being influenced by the chemical shift thereof;

(b) measuring the NMR signal from the sample to be tested at least one of the values of whose permeability and chemical shift is known at timing c other than the timings a and b to acquire image vector information $S_1$ (x, y);

(c) measuring the NMR signal from the sample to be tested at the timing b to provide image vector information $S_2$ (x, y);

(d) measuring the NMR signal from a reference sample both values of whose permeability and chemical shift are known and their spatial distribution is uniform at the timing c other than the timings a and b to provide image vector information $S_{1r}$ (x, y);

(e) measuring the NMR signal from the reference sample is measured at the timing b to provide image information $S_{2r}$ (x, y);

(f) taking a phase difference between the image vector information $S_2$ (x, y) of said sample to be tested and the image vector information $S_{2r}$ (x, y) of said reference sample to remove the influence from nonuniformity of static magnetic field, thereby acquiring first desired phase information due to only first influence from permeability distribution;

(g) taking a phase difference between the image vector information $S_1$ (x, y) of said sample to be tested and the image vector information $S_{1r}$ (x, y) of said reference sample to remove the influence of nonuniformity of static magnetic field, thereby acquiring second desired phase information due to second influence from permeability distribution and from said chemical shift; and (h) eliminating, from said second phase information, said second influence of the permeability distribution on the basis of said first influence from the permeability distribution to provide the phase information influenced from only said chemical shift.

2. A testing method according to claim 1, wherein said timing b is the timing when the rotating phases of nuclear spins of one or plural kinds of said chemical shifts overlap at a prescribed position.

3. A testing method according to claim 1, wherein said step (f) of acquiring said first phase information includes a step of acquiring R (x, y) free from the influence of said static magnetic field nonuniformity by calculating $$R(x, y) = \{S_2(x, y)/|S_2(x, y)|\} \times \{S_{2r}^*(x, y)/|S_{2r}(x, y)|\}$$

where $S_{2r}^*$ (x, y) is a conjugate complex number of $S_{2r}$ (x, y).

4. A testing method according to claim 3, wherein said step (f) of acquiring said first phase information includes a step of eliminating the term of a fixed phase to provide $$R'(x, y) = \exp\{-j\gamma E_{per}(x, y) \cdot T_2\}$$

5. A testing method according to claim 4, wherein said step (f) of acquiring said first phase information includes a step of calculating $$\theta_R(x, y) = \gamma E_{per}(x, y) T_2$$

where $\gamma$ is a magnetic rotating ratio, $T_2$ is the time from the timing a to the timing b, and $E_{per}$ (x, y) is a change in the magnetic flux density due to the permeability distribution.

6. A testing method according to claim 1, wherein said step (g) of acquiring said second phase information includes a step of acquiring R (x, y) free from the influence from said static magnetic field nonuniformity by calculating $$T(x, y) = \{S_1(x, y) \times S_{1r}^*(x, y)/S_{1r}(x, y)\}$$

where $S_{1r}^*$ (x, y) is a conjugate complex number of $S_{2r}$ (x, y).

7. A testing method according to claim 6, wherein said step (h) of eliminating said second influence from the permeability distribution includes a step of subjecting T (x, y) to phase correction so as to provide $$T'(x, y) = T(x, y) \cdot \exp\{j\gamma E_{per}(x, y) \cdot T_1\}$$

where $\gamma$ is a gyromagnetic ratio, $T_1$ is the time from the timing a to the timing c, and $E_{per}$(x, y) is a change in the magnetic flux density calculated by $$E_{per}(x, y) = -\theta_R(x, y)/\gamma T_2$$

where $T_2$ is the time from said timing a to said timing b.

8. A testing method according to claim 7, wherein said step (g) of acquiring said second phase information includes a step of eliminating the term of a fixed phase to provide $$C(x, y) = T'(x, y) \cdot \exp\{-j(\theta_a - \theta_r)\}$$
$$= \rho_1(x, y) + \rho_2(x, y)\exp(j\theta_c)$$

9. A testing method by use of nuclear magnetic resonance comprising the steps of:

(a) determining, after a 180° high frequency pulse is applied, timing a when an interval between timings of applying a 90° pulse and the 180° high frequency pulse has passed and timing b when an NMR signal from the sample to be tested can be measured without being influenced from the chemical shift thereof;

(b) measuring the NMR signal from the sample to be tested at least one of the values of whose permeability and chemical shift is known at the timing b to acquire image vector information $S_2$ (x, y);

(c) measuring the NMR signal from a reference sample both values of whose permeability and chemical shift are known and their spatial distribution is uniform at the timing b to provide image vector information $S_{2r}$ (x, y);

(d) taking a phase difference between the image vector information $S_2$ (x, y) of said sample to be tested and the image vector information $S_{2r}$ (x, y) of said reference sample to remove the influence of nonuniformity of static magnetic field, thereby acquiring phase information due to only influence of permeability distribution;

(e) calculating, using the phase information thus acquired, a change $E_{per}$ (x, y) in the magnetic flux density due to said permeability distribution by $$E_{per}(x, y) = -\theta_R(x, y)/\gamma T_2$$

where $\gamma$ is a gyromagnetic ratio, $T_2$ is the time from timing a to the timing b;

(f) determining the structure of said sample to be tested and supplying it as data for image processing to a data processor;

(g) roughly predicting said permeability distribution on the basis of said data; and (h) simulating the predicted distribution so that it coincides with the measured change $E_{per}(x, y)$ in the magnetic flux density, thereby determining the details of the permeability distribution and its value.

10. A testing apparatus by use of nuclear magnetic resonance comprising:

(a) means for determining, after a 180° high frequency pulse is applied, timing a when an interval between timings of applying a 90° pulse and the 180° high frequency pulse has passed and timing b when an NMR signal from the sample to be tested can be measured without being influenced by the chemical shift thereof;

(b) means for measuring the NMR signal from the sample to be tested at least one of the values of whose permeability and chemical shift is known at timing c other than the timings a and b to acquire image vector information $S_1(x, y)$;

(c) means for measuring the NMR signal from the sample to be tested at the timing b to provide image vector information $S_2(x, y)$;

(d) means for measuring the NMR signal from a reference sample both values of whose permeability and chemical shift are known and their spatial distribution is uniform at the timing c other than the timings a and b to provide image vector information $S_{1r}(x, y)$;

(e) means for measuring the NMR signal from the reference sample is measured at the timing b to provide image information $S_{2r}(x, y)$;

(f) means for taking a phase difference between the image vector information $S_2(x, y)$ of said sample to be tested and the image vector information $S_{2r}(x, y)$ of said reference sample to remove the influence from nonuniformity of static magnetic field, thereby acquiring first desired phase information due to only first influence from permeability distribution;

(g) means for taking a phase difference between the image vector information $S_1(x, y)$ of said sample to be tested and the image vector information $S_{1r}(x, y)$ of said reference sample to remove the influence of nonuniformity of static magnetic field, thereby acquiring second desired phase information due to second influence of permeability distribution and of said chemical shift; and (h) means for eliminating, by said second phase information, said second influence of the permeability distribution on the basis of said first influence of the permeability distribution to provide the phase information influenced by only said chemical shift.

11. A testing apparatus according to claim 10, wherein said timing b is the timing when the rotating phases of nuclear spins of one or plural kinds of said chemical shifts overlap at a prescribed position.

12. A testing apparatus according to claim 10, wherein said reference sample has a larger size than that of said sample to be tested.

13. A testing apparatus according to claim 10, wherein said reference sample is a sphere.

14. A testing apparatus by use of nuclear magnetic resonance comprising:

(a) means for determining, after a 180° high frequency pulse is applied, timing a when an interval between timings of applying a 90° pulse and the 180° high frequency pulse has passed and timing b when an NMR signal from the sample to be tested can be measured without being influenced from the chemical shift thereof;

(b) means for measuring the NMR signal from the sample to be tested at least one of the values of whose permeability and chemical shift is known at the timing b to acquire image vector information $S_2(x, y)$;

(c) means for measuring the NMR signal from a reference sample both values of whose permeability and chemical shift are known and their spatial distribution is uniform at the timing b to provide image vector information $S_{2r}(x, y)$;

(d) means for taking a phase difference between the image vector information $S_2(x, y)$ of said sample to be tested and the image vector information $S_{2r}(x, y)$ of said reference sample to remove the influence of nonuniformity of static magnetic field, thereby acquiring phase information due to only influence of permeability distribution;

(e) means for calculating, using the phase information thus acquired, a change $E_{per}(x, y)$ in the magnetic flux density due to said permeability distribution by $$E_{per}(x, y) = -\theta_R(x, y)/\gamma T_2$$

where $\gamma$ is a gyromagnetic ratio $T_2$ is the time from the timing a to the timing b;

(f) means for determining the structure of said sample to be tested and supplying it as data for image processing to a data processor;

(g) means for roughly predicting said permeability distribution on the basis of said data; and (h) means for simulating the predicted distribution so that it coincides with the measured change $E_{per}(x, y)$ in the magnetic flux density, thereby determining the details of the permeability distribution and its value.

* * * * *